(12) United States Patent
Shao et al.

(10) Patent No.: US 12,342,534 B2
(45) Date of Patent: Jun. 24, 2025

(54) METHOD FOR FABRICATING A SEMICONDUCTOR STRUCTURE WITH PILLAR ARRAY AND SEMICONDUCTOR STRUCTURE

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN); Yi Jiang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 414 days.

(21) Appl. No.: 17/951,112

(22) Filed: Sep. 23, 2022

(65) Prior Publication Data
US 2023/0189508 A1    Jun. 15, 2023

(30) Foreign Application Priority Data
Jun. 24, 2022 (CN) .......................... 202210730323.0

(51) Int. Cl.
*H10B 12/00* (2023.01)
(52) U.S. Cl.
CPC ........... *H10B 12/482* (2023.02); *H10B 12/02* (2023.02)
(58) Field of Classification Search
CPC .............................. H10B 12/02; H10B 12/482
See application file for complete search history.

(56) References Cited

U.S. PATENT DOCUMENTS

| 5,828,094 A * | 10/1998 | Lee | H10B 12/34 257/306 |
|---|---|---|---|
| 2006/0097304 A1 | 5/2006 | Yoon et al. | |
| 2010/0237405 A1* | 9/2010 | Shin | H10D 30/63 438/269 |
| 2023/0170416 A1* | 6/2023 | Xiao | H10B 12/488 257/329 |

* cited by examiner

*Primary Examiner* — Sue A Purvis
*Assistant Examiner* — Sammantha K Salaz
(74) *Attorney, Agent, or Firm* — Kilpatrick Townsend & Stockton LLP

(57) ABSTRACT

Embodiments relate to a method for fabricating a semiconductor structure. The method includes: providing a substrate, where pillars arranged in an array are formed on a surface of the substrate, and bit lines extending along a first direction are formed at bottoms of the pillars; forming, between adjacent two of the pillars, a first groove extending along a second direction; forming an isolation layer on the substrate, where the isolation layer is filled in the first groove and is filled between adjacent two of the bit lines; etching the isolation layer to expose a surface of the pillar, where a first sub isolation layer positioned in the first groove is lower than a second sub isolation layer; forming a word line surrounding a side wall of the pillar, where a surface of the word line is not higher than a surface of the second sub isolation layer; and forming a dielectric layer on the word line.

15 Claims, 11 Drawing Sheets

Provide a substrate, where pillars arranged in an array are formed on a surface of the substrate, and bit lines extending along a first direction are formed at bottoms of the pillars — S102

Form a first groove extending along a second direction between adjacent two of the pillars, the second direction is perpendicular to the first direction — S104

Form a spacer on the substrate, the spacer is filled between the first groove and adjacent two of the bit lines, the spacer includes a first sub spacer and a second sub spacer, where the first sub spacer covers the surface of the substrate, a side wall of the first groove, and a part of a bottom wall of the first groove; and the second sub spacer covers a remaining part of the bottom wall of the first groove — S106

Etch the spacer to expose a surface of the pillar, where a surface of the first sub spacer positioned in the first groove is lower than a surface of the second sub spacer — S108

Form, on the first sub spacer, a word line surrounding a side wall of the pillar, where a surface of the word line is not higher than the surface of the second sub spacer — S1010

Form a dielectric layer on the word line, where the dielectric layer covers the second sub spacer and the word line, and the dielectric layer and the spacer form an isolation structure for the word line — S1012

Fig. 1

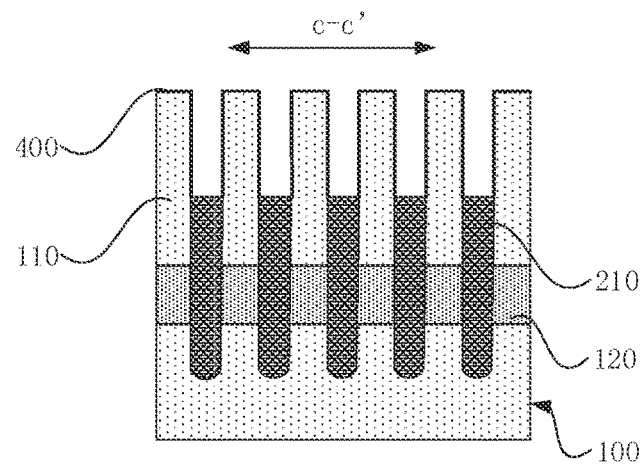

Fig. 9B

| Form a metal layer on the surface of the first sub spacer, where the metal layer fills the first groove and covers the surface of the second sub spacer, and the metal layer surrounds a side surface of the pillar and a side surface of the gate oxide layer, and the metal layer fills the first groove | S1002 |
|---|---|
| Planarize the metal layer until the gate oxide layer positioned on the surface of the pillar is exposed | S1004 |
| Etch the metal layer in the first groove until the surface of the second sub spacer is exposed, to form the word line | S1006 |

Fig. 10

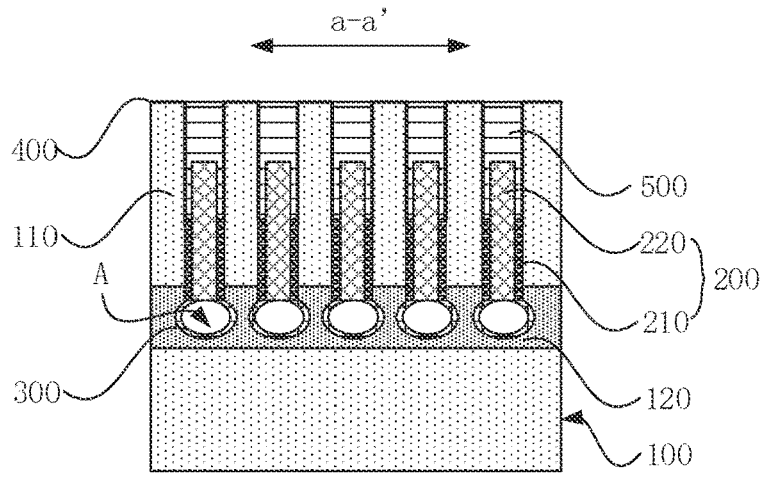

METHOD FOR FABRICATING A SEMICONDUCTOR STRUCTURE WITH PILLAR ARRAY AND SEMICONDUCTOR STRUCTURE

CROSS-REFERENCE TO RELATED APPLICATION

This application claims priority to Chinese Patent Application No. 202210730323.0, titled "METHOD FOR FABRICATING SEMICONDUCTOR STRUCTURE AND SEMICONDUCTOR STRUCTURE" and filed to the State Patent Intellectual Property Office on Jun. 24, 2022, the entire contents of which are incorporated herein by reference.

TECHNICAL FIELD

The present disclosure relates to the field of semiconductor manufacturing process technology, and more particularly, to a method for fabricating a semiconductor structure and a semiconductor structure.

BACKGROUND

With the rapid development of semiconductor fabrication technologies, semiconductor devices are developing toward a direction of higher component density and higher integration, and a development trend of semiconductor process nodes following the Moore's Law is decreasing. As a length of a channel decreases, capability of a gate structure in controlling the channel becomes weaker, thereby causing sub threshold leakage, i.e., short channel effect.

To better meet a requirement of scaling down a device size, for a semiconductor process, planar transistors gradually begin to transition to three-dimensional transistors with higher power efficiency, such as gate-all-around transistors. In a gate-all-around transistor, a gate structure surrounds a channel region. Compared with the planar transistor, the gate structure of the gate-all-around transistor has stronger control capability on the channel, and can better suppress the short channel effect.

However, when a word line in the gate-all-around transistor is fabricated by means of an existing process, space for fabricating the word line is relatively small, and thus it is uneasy to form the word line through deposition, which may cause presence of an empty region in the semiconductor structure fabricated.

SUMMARY

The present disclosure discloses a method for fabricating a semiconductor structure and a semiconductor structure.

To achieve the foregoing objective, the present disclosure provides following technical solutions.

According to a first aspect of the present disclosure, there is provided a method for fabricating a semiconductor structure, including:

providing a substrate, wherein pillars arranged in an array are formed on a surface of the substrate, and bit lines extending along a first direction are formed at bottoms of the pillars;

forming a first groove extending along a second direction between adjacent two of the pillars, the second direction being perpendicular to the first direction;

forming an isolation layer on the substrate, the isolation layer being filled in the first groove and being filled between adjacent two of the bit lines, the isolation layer comprising a first sub isolation layer and a second sub isolation layer, wherein the first sub isolation layer covers the surface of the substrate, a side wall of the first groove, and a part of a bottom wall of the first groove; and the second sub isolation layer covers a remaining part of the bottom wall of the first groove;

etching the isolation layer to expose a surface of the pillar, wherein a surface of the first sub isolation layer positioned in the first groove is lower than a surface of the second sub isolation layer;

forming, on the first sub isolation layer, a word line surrounding a side wall of the pillar, wherein a surface of the word line is not higher than the surface of the second sub isolation layer; and forming a dielectric layer on the word line, wherein the dielectric layer covers the second sub isolation layer and the word line, and the dielectric layer and the isolation layer form an isolation structure for the word line.

According to a second aspect of the present disclosure, a semiconductor structure is provided, which is fabricated by using the method for fabricating a semiconductor structure provided by the above technical solutions.

BRIEF DESCRIPTION OF THE DRAWINGS

FIG. 1 is a flowchart of a method for fabricating a semiconductor structure according to an embodiment of the present disclosure;

FIG. 5A, FIG. 6A, FIG. 7A, FIG. 9A, and FIG. 11A are schematic diagrams of fabricating a subsequent film layer corresponding to FIG. 4A;

FIG. 5C, FIG. 6C, FIG. 7C, FIG. 9B, and FIG. 11C are schematic diagrams of fabricating a subsequent film layer corresponding to FIG. 4C;

FIG. 10 is another flowchart of a method for fabricating a semiconductor structure according to an embodiment of the present disclosure.

Figure 2:
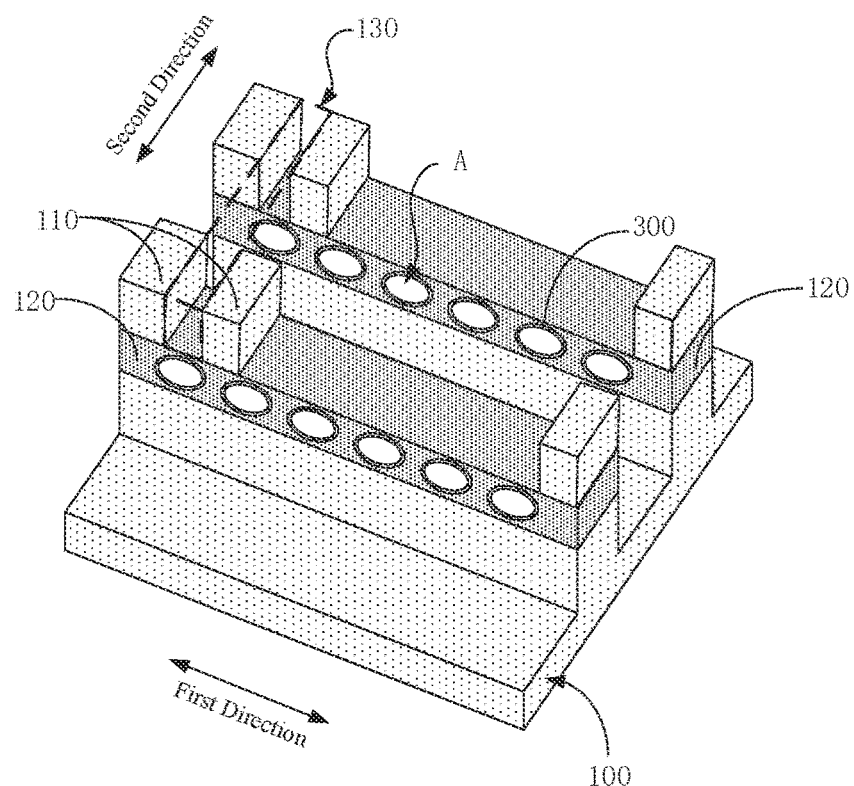
FIG. 2 is a schematic three-dimensional structural diagram of a semiconductor structure according to an embodiment of the present disclosure.

Reference numerals: 100—substrate; 110—pillar; 120—bit line; 130—first groove; 200—isolation layer; 210—first sub isolation layer; 220—second sub isolation layer; 300—bit line metal layer; 400—gate oxide layer; 500—metal layer; 510—word line; 600—dielectric layer; and A-auxiliary groove.

DETAILED DESCRIPTION

Typical embodiments embodying features and advantages of the present disclosure will be described in detail in the following specification. It is to be understood that the present disclosure may have various changes on different embodiments, which does not depart from the scope of the present disclosure, and the description and accompanying drawings therein in essence are used for illustrating but not intended for limiting the present disclosure.

In the following description of different exemplary embodiments of the present disclosure, it is made with reference to the accompanying drawings, which form a part of the present disclosure, and therein different exemplary structures, systems and steps that can implement various aspects of the present disclosure are shown by way of example. It is to be understood that other solutions of components, structures, exemplary apparatuses, systems, and steps may be used, and structural and functional modifications may be made without departing from the scope of the present disclosure. Moreover, although the terms "above", "between", "within", etc. may be used in this specification to describe different exemplary features and elements of the present disclosure, these terms are used herein for convenience only, such as directions of the examples in the accompanying drawings. Nothing in this specification should be understood as requiring a three-dimensional direction of the structure to fall within the scope of the present disclosure.

Figure 3:
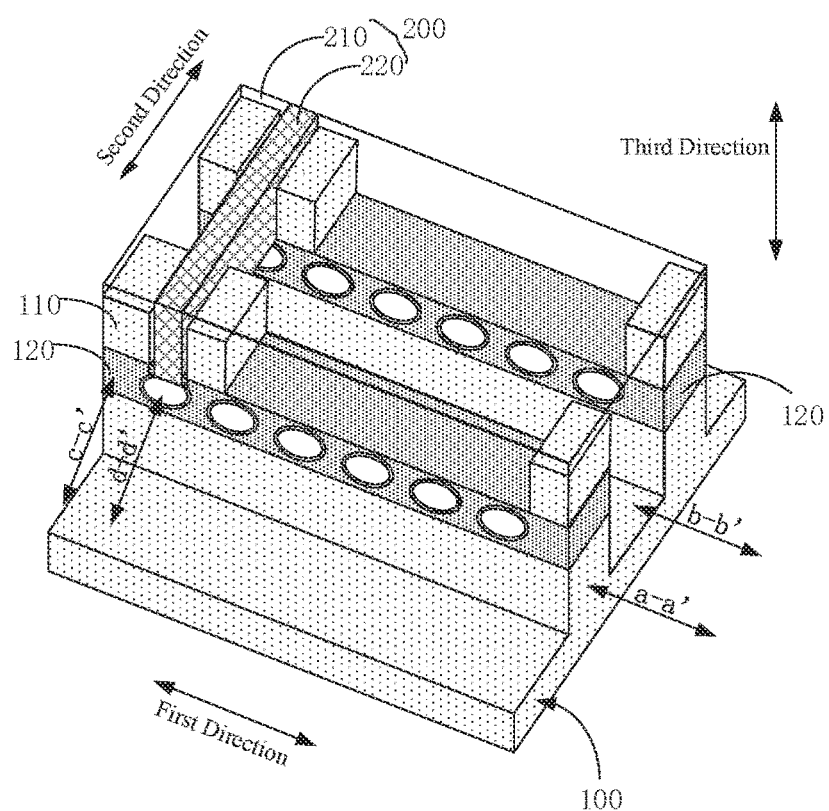
FIG. 3 is another schematic three-dimensional structural diagram of the semiconductor structure according to an embodiment of the present disclosure.
Figure 4A:
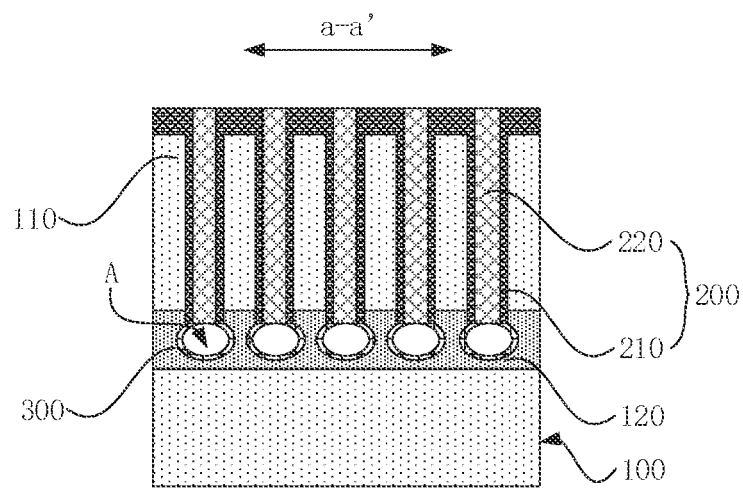
FIG. 4A is a structural sectional view at a-a' in FIG. 3.
Figure 4B:
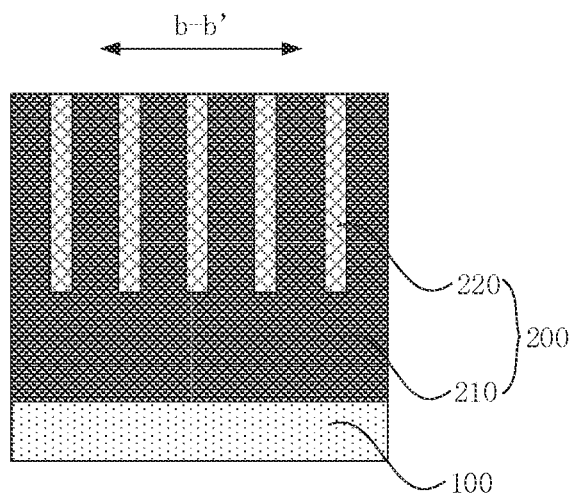
FIG. 4B is a structural sectional view at b-b' in FIG. 3.
Figure 4C:
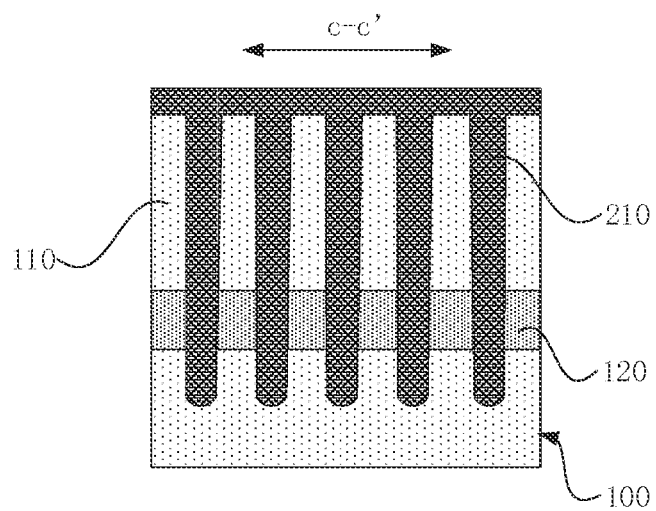
FIG. 4C is a structural sectional view at c-c' in FIG. 3.
Figure 4D:
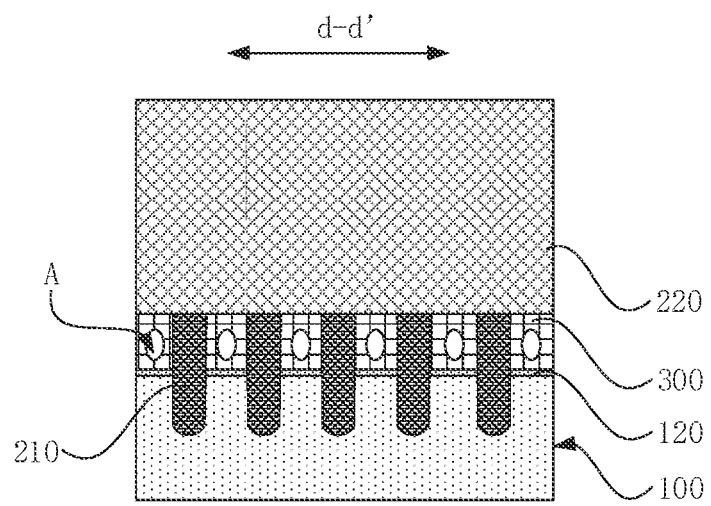
FIG. 4D is a structural sectional view at d-d' in FIG. 3.
Figure 5A:
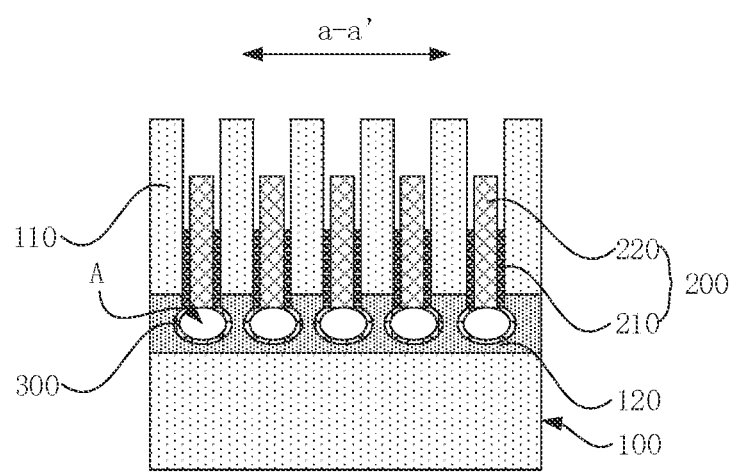
Figure 5B:
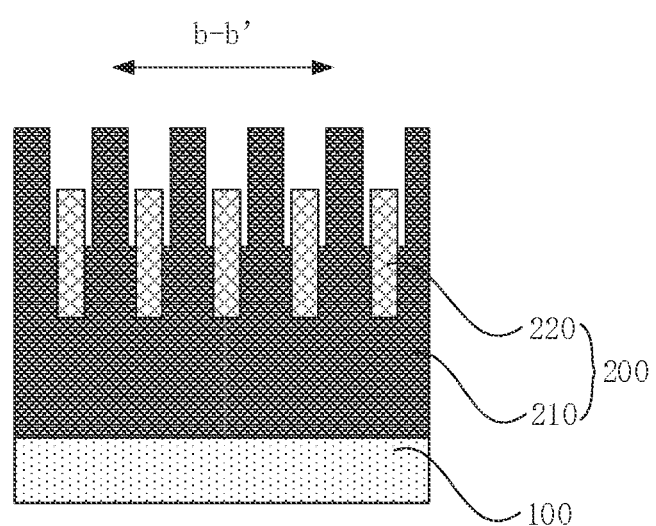
FIG. 5B, FIG. 6B, FIG. 7B, and FIG. 11B are schematic diagrams of fabricating a subsequent film layer corresponding to FIG. 4B.
Figure 5C:
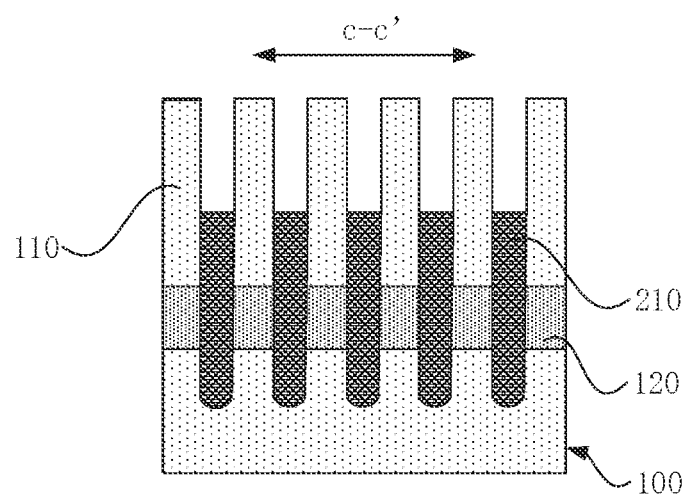
Figure 5D:
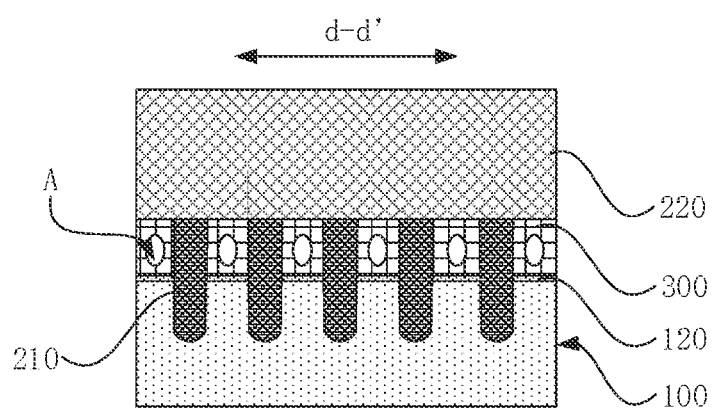
FIG. 5D, FIG. 6D, FIG. 7D, and FIG. 11D are schematic diagrams of fabricating a subsequent film layer corresponding to FIG. 4D.

According to a first aspect, an embodiment of the present disclosure provides a method for fabricating a semiconductor structure. FIG. 1 is a flowchart of a method for fabricating a semiconductor structure according to an embodiment of the present disclosure; FIG. 2 is a schematic three-dimensional structural diagram of a semiconductor structure according to an embodiment of the present disclosure; and FIG. 3 is another schematic three-dimensional structural diagram of a semiconductor structure according to an embodiment of the present disclosure. As shown in FIG. 1 to FIG. 3, the method for fabricating a semiconductor structure provided by this embodiment of the present disclosure includes following steps.

Step S102: providing a substrate 100, where pillars 110 arranged in an array are formed on a surface of the substrate 100, and bit lines 120 extending along a first direction are formed at bottoms of the pillars 110.

Step S104: forming a first groove 130 extending along a second direction between adjacent two of the pillars 110. It is to be understood that the second direction is perpendicular to the first direction.

Step S106: forming an isolation layer 200 on the substrate 100, where the isolation layer 200 is filled in the first groove 130 and is filled between adjacent two of the bit lines 120, to form, for example, a structure as shown in FIG. 3. With continued reference to the structure as shown in FIG. 3 in conjunction with FIGS. 4A to 4D, the isolation layer 200 includes a first sub isolation layer 210 and a second sub isolation layer 220, where the first sub isolation layer 210 covers the surface of the substrate 100, a side wall of the first groove 130, and a part of a bottom wall of the first groove 130; and the second sub isolation layer 220 covers a remaining part of the bottom wall of the first groove 130.

Step S108: etching the isolation layer 200 to expose a surface of the pillar 110, where a surface of the first sub isolation layer 210 positioned in the first groove 130 is lower than a surface of the second sub isolation layer 220. For example, structures as shown in FIGS. 5A to 5D are formed.

Step S1010: forming, on the first sub isolation layer 210, a word line 510 surrounding a side wall of the pillar 110, for example, forming structures as shown in FIGS. 6A to 6D, where a surface of the word line 510 is not higher than the surface of the second sub isolation layer 220; and Step S1012: forming a dielectric layer 600 on the word line 510, for example, forming structures as shown in FIGS. 7A to 7D, where the dielectric layer 600 covers the second sub isolation layer 220 and the word line 510, and the dielectric layer 600 and the isolation layer 200 form an isolation structure for the word line 510.

Figure 8:
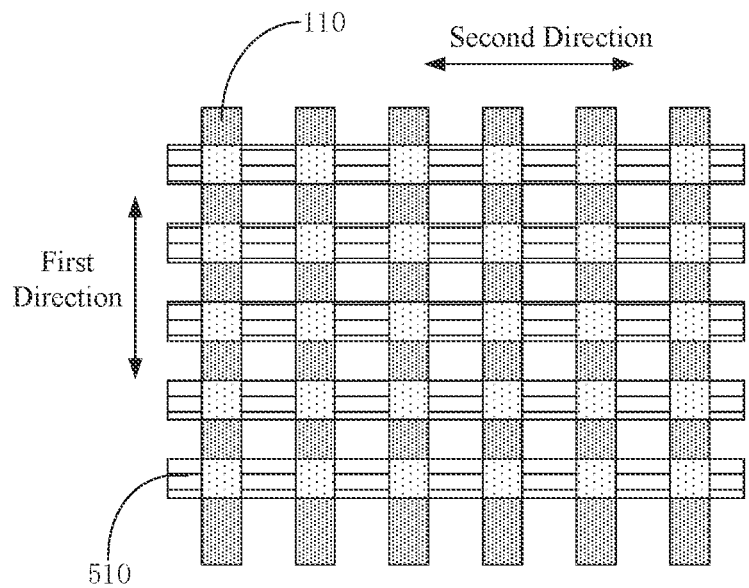
FIG. 8 is a brief schematic structural diagram of a word line and a bit line fabricated by using the method for fabricating a semiconductor structure according to an embodiment of the present disclosure.

It is worth noting that for a structure as shown in FIG. 8, a bit line 120 fabricated by using the method for fabricating a semiconductor structure provided by the embodiment of the present disclosure is positioned in the pillar 110 and extends along the first direction; and the word line 510 fabricated is positioned in the first groove 130 and extends along the second direction perpendicular to the first direction.

When the method for fabricating a semiconductor structure provided by the embodiment of the present disclosure is applied, the isolation layer 200 positioned between the word line 510 and the bit line 120 is first fabricated, next the word line 510 is fabricated, and then the dielectric layer 600 is filled, such that the dielectric layer 600 matches up with the first sub isolation layer 210 and the second sub isolation layer 220 to form an isolation structure for the word line 510.

It should be noted that in the method for fabricating a semiconductor structure provided by the embodiment of the present disclosure, isolation structures in different regions are separately fabricated. In some embodiments, the isolation layer 200 including the first sub isolation layer 210 and the second sub isolation layer 220 is fabricated earlier than the word line 510, to enlarge an opening for fabricating the word line 510. In addition, a depth-to-width ratio of a channel during deposition of the word line 510 is decreased, to improve deposition quality of the word line 510. In addition, the dielectric layer 600 is fabricated later than the word line 510, to provide isolation protection to the word line 510 and other structures.

It is worth noting that in the process of fabricating the word line 510, the dielectric layer 600 is not fabricated yet and the first groove 130 is in an opening shape. Therefore, the word line 510 can be relatively easily fabricated on the surface of the first sub isolation layer 210 in the first groove 130, thereby simplifying the fabrication processes. In addition, in the process of fabricating the word line 510, because the word line 510 is not blocked by the dielectric layer 600, the word line 510 may quickly fill up an opening formed at an intersection between the surface of the first sub isolation layer 210 and a surface of the second sub isolation layer 220, to avoid occurrence of a deposition void region, and increase yield of semiconductor structure.

It is worth noting that the method for fabricating a semiconductor structure provided by the embodiment of the present disclosure further has a third direction. As shown in FIG. 3, the third direction is perpendicular to both the second direction and the first direction.

It is to be understood that the substrate 100 is configured to provide a process platform for subsequent formation of a transistor. With continued reference to the structure as shown in FIG. 3, the substrate 100 includes a leveling region and multiple pillars 110 formed on a surface of the leveling region. It is worth noting that, along the third direction, the leveling region forms a "bottom", and a "surface" of each film layer refers to a side away from the leveling region of the substrate 100 along the third direction.

In one embodiment, a material of the substrate 100 may be silicon. In other embodiments, the material of the substrate 100 may further be other material such as germanium, silicon germanium, silicon carbide, gallium arsenide or indium gallium. In some embodiments, the substrate 100 may also be other type of substrate 100 such as a silicon-on-insulator substrate 100 or a germanium-on-insulator substrate 100, which is not to be described in detail.

In one embodiment, the surface of the first sub isolation layer 210 in the isolation layer 200 formed in Step S106 may be controlled to be flush with the surface of the second sub isolation layer 220, to facilitate subsequent etching.

It is worth noting that when etching the isolation layer 200, only the first sub isolation layer 210 may be etched. In this case, an original height of the second sub isolation layer 220 remains unchanged. In some embodiments, when etching the isolation layer 200, both the first sub isolation layer 210 and the second sub isolation layer 220 may be etched simultaneously.

It should be noted that by etching away a part of the second sub isolation layer 220, the height of the second sub isolation layer 220 in the third direction may be reduced, to save a support structure, thereby facilitating subsequent fabrication of the word line 510 and facilitating fabrication of a gate-all-around (GAA) structure.

In one embodiment, with continued reference to the structures as shown in FIG. 3, FIG. 4A to FIG. 4D, and FIG. 5A to FIG. 5D, in Step S108, the step of etching the isolation layer 200 includes:

etching the isolation layer 200 to expose the surface of the pillar 110, where the first sub isolation layer 210 and the second sub isolation layer 220 have a preset etching selectivity, and an etching rate of the first sub isolation layer 210 is greater than that of the second sub isolation layer 220; and continuing etching the first sub isolation layer 210 and the second sub isolation layer 220 until the surface of the first sub isolation layer 210 positioned in the first groove 130 is lower than the surface of the second sub isolation layer 220, and the surface of the second sub isolation layer 220 is lower than the surface of the pillar 110.

In some embodiments, by controlling an etching rate ratio of the second sub isolation layer 220 to the first sub isolation layer 210, an etching depth of the second sub isolation layer 220 and an etching depth of the first sub isolation layer 210 may be controlled, to control a size of the word line 510 along the third direction, thereby facilitating fabrication of the word line 510 and simplifying the fabrication processes.

It should be noted that a "selective etching" manner is used in the foregoing method. In this manner, only different parts of the isolation layer 200 may be etched as required without etching damage to the pillar 110, to meet different thickness requirements of the isolation layer 200.

In one embodiment, the preset etching selectivity between the first sub isolation layer 210 and the second sub isolation layer 220 ranges from 2 to 5. For example, when a preset etching selectivity is selected to be 2, if the etching rate of the second sub isolation layer 220 is 1, the etching rate of the first sub isolation layer 210 is 2. That is, the etching rate of the first sub isolation layer 210 is twice that of the second sub isolation layer 220.

It is worth noting that when a range of the preset etching selectivity is small, the etching depth of the first sub isolation layer 210 may fail to meet requirements, thereby having a negative effect on the size of the word line 510 fabricated subsequently. However, when the range of the preset etching selectivity is large, a thickness of the first sub isolation layer 210 may be adversely affected, such that the first sub isolation layer 210 may fail to effectively provide isolation and protection.

It is to be understood that when the range of the preset etching selectivity is set 2 to 5, the foregoing two problems can be effectively balanced. In some embodiments, when the preset etching selectivity is set 2 to 5, it may be ensured that the etching rate of the first sub isolation layer 210 is greater than that of the second sub isolation layer 220, such that an appropriate height difference is formed between the surface of the first sub isolation layer 220 etched and the surface of the second sub isolation layer 220 etched, and the size of the word line 510 to be fabricated subsequently is ensured. In addition, when the preset etching selectivity is set 2 to 5, an isolation and protection effect of the first sub isolation layer 210 on the bit line 120 and the word line 510 can be ensured.

In one embodiment, the etching the isolation layer 200 includes:

etching the first sub isolation layer 210 and the second sub isolation layer 220 by means of an etching-back process.

It should be noted that both the first sub isolation layer 210 and the second sub isolation layer 220 are positioned in the first groove 130, and along the first direction, the first sub isolation layer 210 wraps two sides of the second sub isolation layer 220. The etching-back process may meet some etching requirements for the first sub isolation layer 210 and the second sub isolation layer 220 in the first groove 130, to enlarge space required for subsequent fabrication of the word line 510, such that yield of the semiconductor structure fabricated can be increased.

For example, etching of the first sub isolation layer 210 and the second sub isolation layer 220 may be completed by means of cooperation between hydrogen fluoride (HF) and ammonia gas ($NH_3$).

In one embodiment, with continued reference to the structures as shown in FIG. 2 and FIG. 3, in Step S106, the forming the isolation layer 200 on the substrate 100 includes:

forming the first sub isolation layer 210 on the surface of the substrate 100, where the first sub isolation layer 210 is filled in the first groove 130 and is filled between the adjacent bit lines 120, and the first sub isolation layer 210 covers the surface of the pillar 110;

patterning the first sub isolation layer 210, and forming, in the first sub isolation layer 210 in the first groove 130, a second groove extending along the second direction, where a surface of the bit line 120 is exposed from the second groove, and a width of the second groove in the first direction is smaller than that of the first groove 130 in the first direction; and filling the second groove with the second sub isolation layer 220.

It is to be understood that the second groove is not shown in FIG. 3, and the second groove is a part where the second sub isolation layer 220 is filled.

It should be noted that because the second groove exposes the surface of the bit line 120, the second sub isolation layer 220 may directly cover the surface of the bit line 120, to effectively provide isolation protection to the bit line 120 and the word line 510.

Figure 9A:
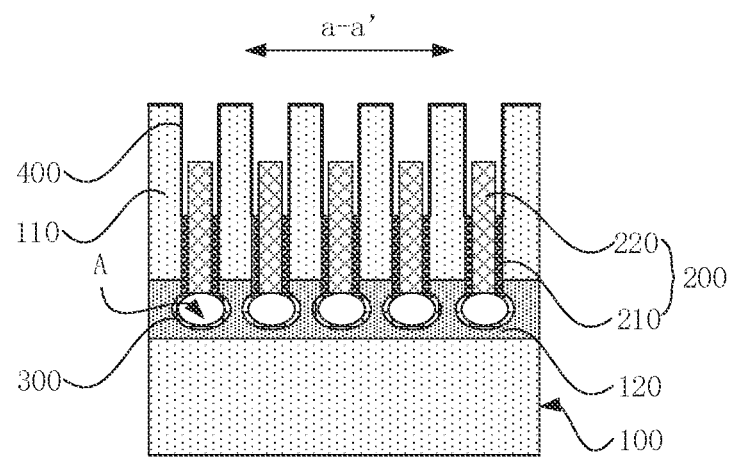
Figure 11B:
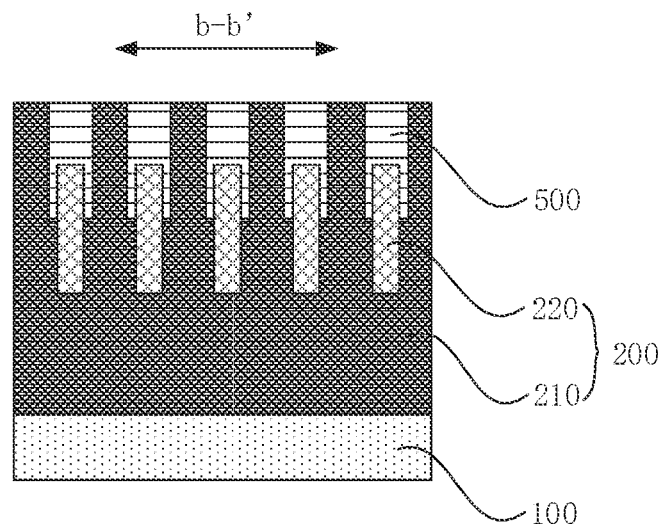
Figure 11C:
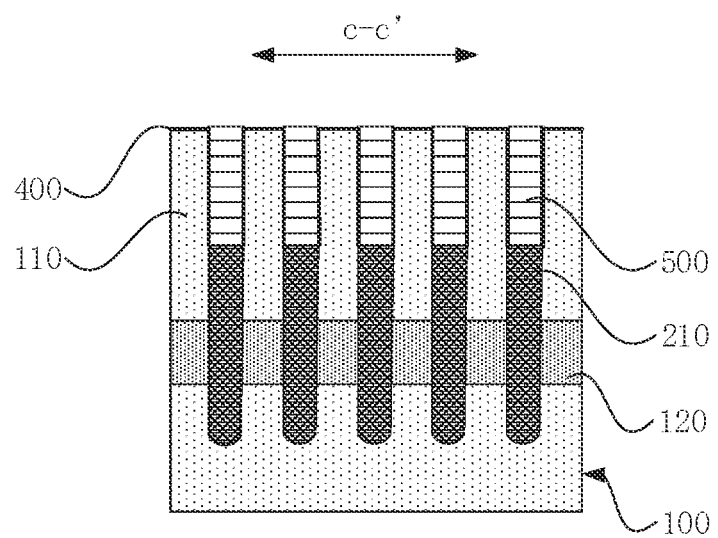
Figure 11D:
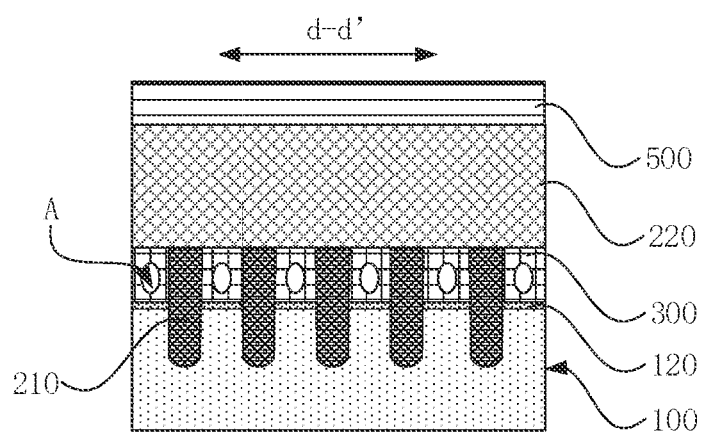

In one embodiment, in Step S1010, before the forming, on the first sub isolation layer 210, a word line 510 surrounding a side wall of the pillar 110, the method further includes:

forming a gate oxide layer 400 on the substrate 100, where the gate oxide layer 400 covers the surface of the pillar 110 and a side wall, not covered by the first sub isolation layer 210, of the pillar 110. For example, reference is made to structures as shown in FIGS. 9A to 9B.

It is to be understood that the gate oxide layer 400 is only formed on an uncovered surface of the substrate 100. Therefore, compared with the structures shown in FIG. 5A to FIG. 5D, film layer structures are changed only at a-a' and c-c'.

It is worth noting that the gate oxide layer 400 is arranged vertically to the substrate 100, to make preparation for subsequent formation of a vertical gate-all-around (VGAA) transistor. It is worth noting that a channel of the VGAA transistor extends in a direction perpendicular to the surface of the substrate 100. In this way, area utilization efficiency of the semiconductor structure can be improved, thereby further reducing a feature size.

In addition, it is worth noting that the VGAA transistor further has a source region and a drain region, and along the third direction, the source region and the drain region are positioned on two sides of a gate. That is, in the semiconductor structure provided in this embodiment of the present disclosure, the pillar 110 has been ion-doped, and subsequently a channel region and the source region or drain region positioned above the channel region are formed in the pillar 110 covered by the gate oxide layer 400, which are not shown in the figures. Of course, after the semiconductor structures shown in FIG. 7A to FIG. 7D are fabricated, another drain region or source region needs to be formed in a lower region, not covered by the gate oxide layer 400, of the pillar 110. A position and fabrication processes may be set as required, and details thereof are not repeated herein.

Of course, after the semiconductor structures shown in FIG. 7A to FIG. 7D are fabricated, other structures also need to be fabricated to form the VGAA transistor structure, which may be set as required, and details are not repeated herein.

Figure 6A:
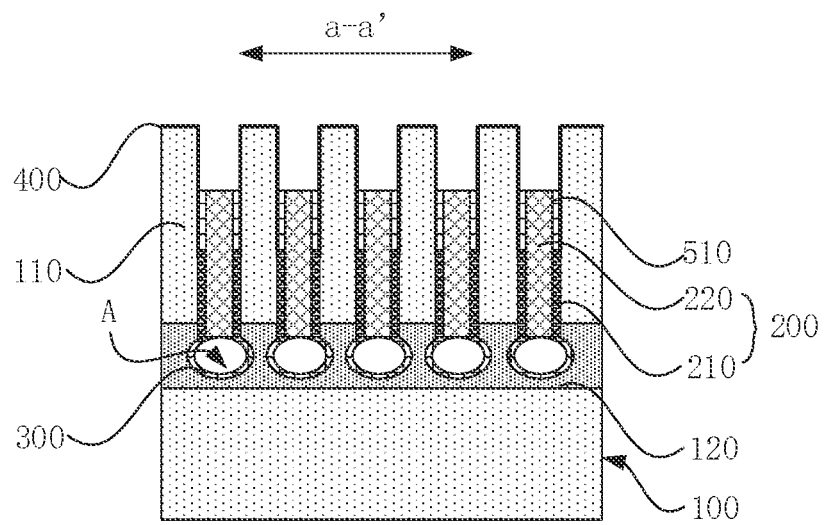
Figure 6B:
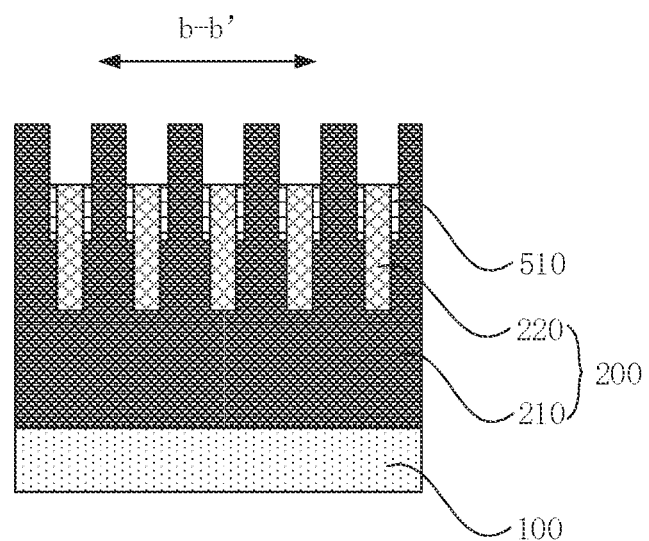
Figure 6C:
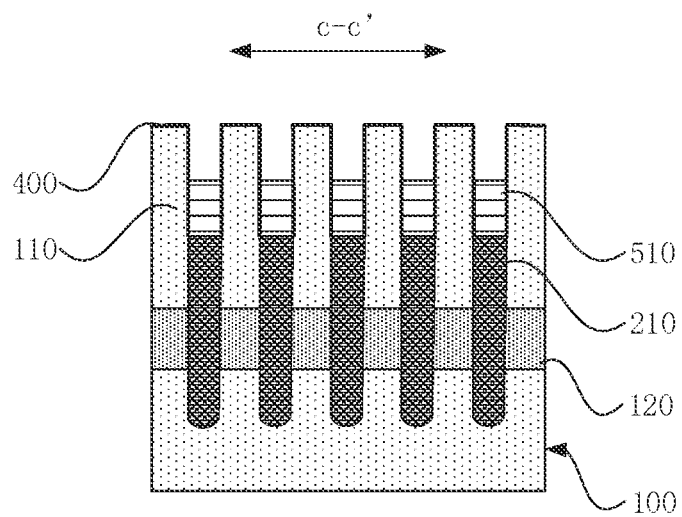
Figure 6D:
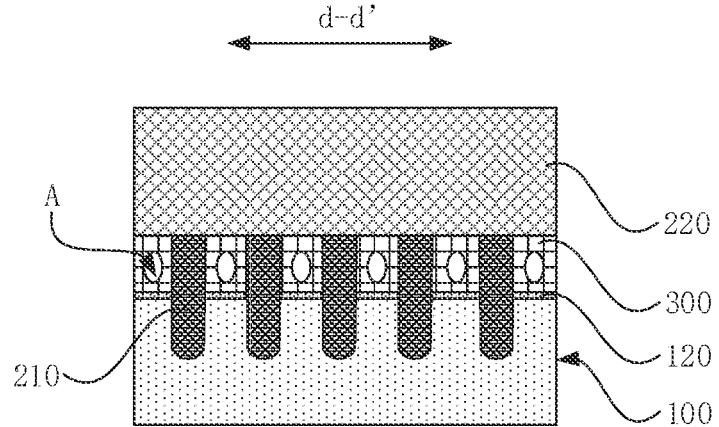

In one embodiment, referring to the structure shown in FIG. 10, in Step S1010, the forming, on the first sub isolation layer 210, a word line 510 surrounding a side wall of the pillar 110 includes:

Step S1002: forming a metal layer 500 on the surface of the first sub isolation layer 210, where the metal layer 500 fills the first groove 130 and covers the surface of the second sub isolation layer 220, and the metal layer 500 surrounds a side surface of the pillar 110 and a side surface of the gate oxide layer 400;

Step S1004: planarizing the metal layer 500 until the gate oxide layer 400 positioned on the surface of the pillar 110 is exposed, for example, to form the structures shown in FIG. 11A to FIG. 11D; and Step S1006: etching back the metal layer 500 until the surface of the second sub isolation layer 220 is exposed, such that the metal layer 500 remained forms the word line 510 extending along the second direction, for example, the structures shown in FIG. 6A to FIG. 6B are formed.

It is worth noting that when the metal layer 500 is formed by means of fabrication, the metal layer 500 is not only filled in the first groove 130, but also covers a surface of the gate oxide layer 400. To obtain a pattern of the word line 510 by means of etching subsequently, the metal layer 500 on the surface of the gate oxide layer 400 needs to be removed first. When etching back the metal layer 500, a surface of the metal layer 500 is etched until the second sub isolation layer 220 is exposed, such that when the dielectric layer 600 is subsequently fabricated, the dielectric layer 600 covers the second sub isolation layer 220 and the word line 510, to form an effective isolation structure.

It should be noted that when the dielectric layer 600 covers the second sub isolation layer 220, it may be ensured that the dielectric layer 600 matches up with the isolation layer 200 to form the effective isolation structure.

Figure 12:
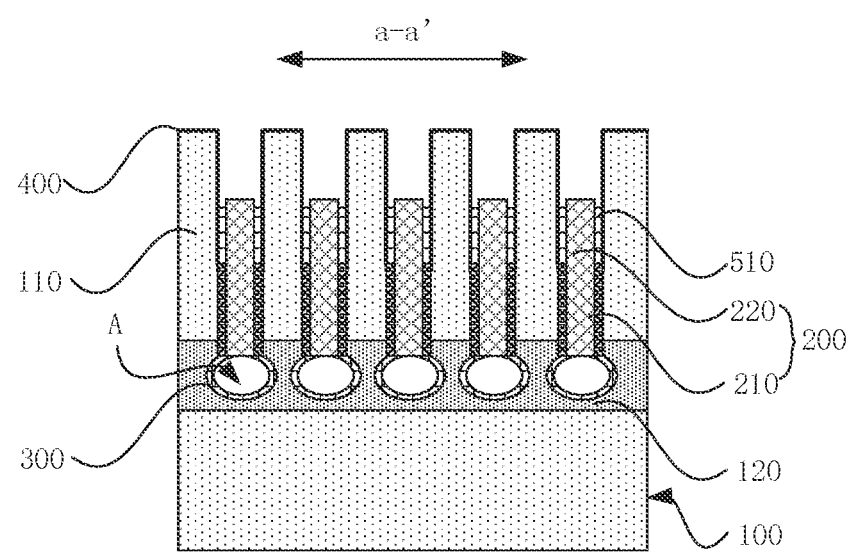
FIG. 12 is another schematic structural diagram of a word line according to an embodiment of the present disclosure.

In one embodiment, as shown in FIG. 12, the surface of the word line 510 is lower than that of the second sub isolation layer 220.

It should be noted that when the surface of the word line 510 is lower than that of the second sub isolation layer 220, the dielectric layer 600 fabricated subsequently may be partially placed in a layer difference space between the surface of the word line 510 and the surface of the second sub isolation layer 220, such that the dielectric layer 600 may sufficiently come into contact with the second sub isolation layer 220, to ensure that the isolation structure formed by means of cooperation can effectively isolate the word line 510 from other structures.

In another embodiment, as shown in FIG. 6A, the surface of the word line 510 is flush with that of the second sub isolation layer 220.

It should be noted that when the surface of the word line 510 is flush with that of the second sub isolation layer 220, the surface of the word line 510 and the surface of the second sub isolation layer 220 form a plane, thereby facilitating fabrication of the dielectric layer 600 in the first groove 130, such that the dielectric layer 600 can be sufficiently filled everywhere in the first groove 130 as much as possible, to ensure that the isolation structure formed by means of cooperation can effectively isolate the word line 510 from other structures.

In one embodiment, a material of the metal layer 500 is one of molybdenum (Mo), cobalt (Co), tungsten (W) or titanium (Ti).

It should be noted that molybdenum (Mo), cobalt (Co), tungsten (W) or titanium (Ti) is transition metal, and the metal layer 500 fabricated by using the transition metal is a transition metal layer 500.

Of course, the metal layer 500 may also be formed by means of a derivative of Mo, Co, W or Ti. In some embodiments, the material of the metal layer 500 may be a transition metal silicide formed from tungsten silicide, cobalt silicide, nickel silicide or titanium silicide.

In one embodiment, the material for fabricating the metal layer 500 is molybdenum. It is to be understood that a resistance of molybdenum is relatively low, which is advantageous to improving using effect of the word line 510.

In one embodiment, the forming a metal layer 500 on the first sub isolation layer 210 includes:

deposing one of molybdenum, cobalt or tungsten by means of atomic layer deposition, to form the metal layer 500.

It should be noted that the atomic layer deposition (ALD) is a method for forming a deposited film by alternately inputting gas-phase precursor pulses into a reactor and carrying out chemical adsorption and reaction on a deposition substrate. A deposition parameter of the metal layer 500 fabricated by means of ALD are highly controllable, and deposition uniformity and consistency of the deposited metal layer 500 can be improved.

In one embodiment, the forming a metal layer 500 on the first sub isolation layer 210 includes:

deposing titanium by means of vapor deposition, to form the metal layer 500.

It should be noted that chemical vapor deposition (CVD) is a method for synthesizing coatings or nanomaterials based on reaction of chemical gases or vapors on a surface of a substrate. The CVD has simple fabrication processes, and can improve fabrication efficiency.

In one embodiment, the planarizing the metal layer 500 includes:

planarizing the metal layer 500 by means of chemical mechanical polishing until the gate oxide layer 400 positioned on the surface of the pillar 110 is exposed.

It is to be understood that the chemical mechanical polishing (CMP) is a key process for implementing planarization of wafer surface during fabrication of an integrated circuit. Different from a traditional purely mechanical or purely chemical polishing method, the CMP process implements removal of different materials at a micron/nanometric scale on the wafer surface based on combination of surface chemical action and mechanical grinding, to achieve nanoscale planarization of the wafer surface, thereby ensuring a photolithography process in a next step to proceed.

Main working principles of the CMP process are as follows. Under a certain pressure and in presence of a polishing liquid, a polished wafer moves relative to a polishing pad, and by the aid of highly organic combination of a mechanical grinding action of nano grinding materials and a chemical action of various chemical reagents, the surface of the polished wafer achieves requirements of higher planarization, lower surface roughness, and fewer defects.

It should be noted that the metal layer 500 is planarized by means of the CMP, such that a planarized structure has higher flatness, lower surface roughness and fewer defects, thereby facilitating fabrication of other film layer structure on the surface of the exposed gate oxide layer 400 in subsequent processes.

In one embodiment, the forming a gate oxide layer 400 on the substrate 100 includes:

growing the gate oxide layer 400 on the surface of the pillar 110 and the side wall, not covered by the first sub isolation layer 210, of the pillar 110 by means of an in-situ steam generation process or a rapid thermal oxidation process.

It should be noted that the gate oxide layer 400 can be rapidly grown on the surface of the substrate 100 by means of an in-situ steam generation (ISSG) or rapid thermal oxidation (RTO) technology, to increase the fabrication efficiency, such that more semiconductor structures are fabricated within a same time, which is beneficial to increase semiconductor yield.

In one embodiment, a material of the first sub isolation layer 210 is an oxide, and a material of the second sub isolation layer 220 is a nitride.

It is worth noting that, before the second sub isolation layer 220 is formed, the first sub isolation layer 210 formed of an oxide is fabricated first, such that an interface characteristic between the substrate 100 and the isolation layer 200 can be improved. A material of the first sub isolation layer 210 may be, but is not limited to, a silicon dioxide.

In addition, when a material of the second sub isolation layer 220 is selected to be a nitride, selective etching may be facilitated.

In one embodiment, the material of the second sub isolation layer 220 is silicon nitride (SiN) or silicon oxynitride (SiON).

In one embodiment, a material of the dielectric layer 600 is an oxide or a nitride.

It is to be understood that the dielectric layer 600 made of a nitride or an oxide can match up with the second sub isolation layer 220 to form a part of the isolation structure.

In one embodiment, the material of the dielectric layer 600 is a nitride.

It is to be understood that the material of the dielectric layer 600 and the material of the second sub isolation layer 220 may be the same or may be different. In one embodiment, the material of the dielectric layer 600 is the same as the material of the second sub isolation layer 220, such that the dielectric layer 600 and the second sub isolation layer 220 can effectively exert the isolation and protection effect.

In another embodiment, the material of the dielectric layer 600 is an oxide.

With continued reference to the structure shown in FIG. 2, in Step S102, the forming the bit line 120 at a bottom of the pillar 110 includes:

connecting bottoms of a plurality of pillars 110 arranged along the second direction to each other, an initial groove being provided between a plurality of pillars 110 arranged along the first direction;

forming an auxiliary groove A at a bottom of the initial groove;

filling an auxiliary metal layer in the auxiliary groove A; and forming at least a part of the bit line 120 within the bottom of the pillar 110 by thermally treating the auxiliary metal layer.

It should be noted that the auxiliary groove A is positioned at the bottom of the pillar 110. In the first direction, a width of the auxiliary groove A is greater than that of the initial groove, thereby reducing a width of the bottom of the pillar 110 and facilitating diffusion of metal on the surface of the auxiliary groove A to the bottom of the pillar 110, to form the metal silicide at the bottom of the pillar 110.

It is worth noting that, after at least part of the bit line 120 is formed, the auxiliary metal layer on the surface of the auxiliary groove A needs to be removed, to prevent adjacent bit lines 120 from being connected by means of the auxiliary metal layer. After the auxiliary metal layer is removed, deposition of a bit line metal layer 300 can be continued on the surface of the auxiliary groove A, to form a structure of the bit line 120 with a relatively low resistance.

It is to be understood that the bit line metal layer 300 is positioned on the surface of the auxiliary groove A. For example, the bit line metal layer 300 in this embodiment of the present disclosure is shown as Mo. A white oval structure in FIG. 2 is a structure obtained after the auxiliary groove A is filled with the bit line metal layer 300. A depth of the initial groove is greater than that of the first groove 130, that is, the first groove 130 is formed on a basis of the initial groove.

It should be noted that the auxiliary groove A has an opening at a top surface and the opening is not shown in FIG. 2. When the isolation layer 200 is fabricated, if the opening is relatively small, the isolation layer 200 may be formed only at the opening of the auxiliary groove A; if the opening is relatively large, the isolation layer 200 may be formed inside the auxiliary groove A; and the auxiliary groove A may also be filled up with the metal layer 300.

It is to be understood that when the isolation layer 200 is formed inside the auxiliary groove A, in some embodiments, the first sub isolation layer 210 and/or the second sub isolation layer 220 may be formed inside the auxiliary groove A.

In one embodiment, when a main body of the bit line 120 is fabricated, a metal silicide may be formed by a material of a part of the substrate 100 at the bottom of the pillar 110 based on reaction between the auxiliary metal layer and the substrate 100. For example, the forming the bit line 120 includes: forming the metal silicide using this part of silicon substrate 100 by means of a rapid thermal process, to form an ohmic contact and reduce a resistance.

It is to be understood that the "ohmic contact" is formed as below. When a semiconductor comes into contact with metal, a barrier layer may be formed in most cases, but when semiconductor doping concentration is high, electrons may pass through the barrier through a tunneling effect, thereby forming a low-resistance ohmic contact.

According to a second aspect, an embodiment of the present disclosure provides a semiconductor structure, which is fabricated by using the method for fabricating a semiconductor structure provided by any one of the foregoing technical solutions.

With continued reference to structures as shown in FIG. 7A to FIG. 7D, when the method for fabricating a semiconductor structure provided in the first aspect is applied, the isolation layer 200 positioned between the word line 510 and the bit line 120 is first fabricated, next the word line 510 is fabricated, and then the dielectric layer 600 is filled, such that the dielectric layer 600 matches up with the first sub isolation layer 210 and the second sub isolation layer 220 to form an isolation structure for the word line 510.

It should be noted that in the method for fabricating a semiconductor structure provided by the present disclosure, isolation structures in different regions are separately fabricated. In some embodiments, the isolation layer 200 including the first sub isolation layer 210 and the second sub isolation layer 220 is fabricated earlier than the word line 510, to enlarge an opening for fabricating the word line 510. In addition, a depth-to-width ratio of a channel during deposition of the word line 510 is decreased, to improve deposition quality of the word line 510. In addition, the dielectric layer 600 is fabricated later than the word line 510, to provide isolation protection to the word line 510 and other structures.

It is worth noting that in the process of fabricating the word line 510, the dielectric layer 600 is not fabricated yet and the first groove 130 is in an opening shape. Therefore, the word line 510 can be relatively easily fabricated on the surface of the first sub isolation layer 210 in the first groove 130, thereby simplifying the fabrication processes. In addition, in the process of fabricating the word line 510, because the word line 510 is not blocked by the dielectric layer 600, the word line 510 may quickly fill up an opening formed at an intersection between the surface of the first sub isolation layer 210 and a surface of the second sub isolation layer 220, to avoid occurrence of a deposition void region, and increase yield of semiconductor structure.

It should be noted that the semiconductor structure fabricated by using the foregoing fabrication method has a relatively high yield. In the method for fabricating a semiconductor structure provided by the present disclosure, isolation structures in different regions are separately fabricated. In some embodiments, an isolation layer including a first sub isolation layer and a second sub isolation layer is fabricated earlier than a word line, to increase an opening for fabricating the word line. In addition, a depth-to-width ratio of a channel during deposition of the word line is decreased, to improve deposition quality of the word line. In addition, a dielectric layer is fabricated later than the word line, to provide isolation protection to the word line and other structures. It is worth noting that in a process of fabricating the word line, the dielectric layer is not fabricated yet and a first groove is in an opening shape. Therefore, the word line can be relatively easily fabricated on a surface of the first sub isolation layer in the first groove, thereby simplifying the fabrication processes. In addition, in the process of fabricating the word line, because the word line is not blocked by the dielectric layer, the word line may quickly fill up an opening formed at an intersection between the surface of the first sub isolation layer and a surface of the second sub isolation layer, to avoid occurrence of a deposition void region, and increase yield of the semiconductor structure.

According to a third aspect, an embodiment of the present disclosure provides a semiconductor structure. With continued reference to the structures shown in FIG. 7A to FIG. 7D, the semiconductor structure includes:

a substrate 100, where pillars 110 arranged in an array are formed on a surface of the substrate 100, and bit lines 120 extending along a first direction are formed at bottoms of the pillars 110; a first groove 130 extending along a second direction is formed between adjacent two of the pillars 110, and the second direction is perpendicular to the first direction;

an isolation layer 200 positioned between the first groove 130 and adjacent two of the bit lines 120, where the isolation layer 200 includes a first sub isolation layer 210 and a second sub isolation layer 220, the first sub isolation layer 210 covers a part of a side wall of the first groove 130 and a part of a bottom wall of the first groove 130; the second sub isolation layer 220 covers a remaining bottom wall of the first groove 130; a top surface of the first sub isolation layer 210 is lower than a top surface of the pillar 110, and the top surface of the first sub isolation layer 210 is lower than a top surface of the second sub isolation layer 220;

a word line 510 positioned on a side of the first sub isolation layer 210 away from the substrate 100 and surrounding a side wall of the pillar 110, where a top surface of the word line 510 is not higher than the top surface of the second sub isolation layer 220; and a dielectric layer 600 positioned on a side of the word line 510 away from the first sub isolation layer 210, where the dielectric layer 600 connects the second sub isolation layer 220 and the word line 510, and the dielectric layer 600 and the isolation layer 200 form an isolation structure for the word line 510.

It is worth noting that, for a structure as shown in FIG. 8, in the semiconductor structure, the bit line 120 is positioned in the pillar 110 and extends along the first direction; and the word line 510 is positioned in the first groove 130 and extends along the second direction perpendicular to the first direction.

When the semiconductor structure is fabricated, the isolation layer 200 positioned between the word line 510 and the bit line 120 may be first fabricated, next the word line 510 is fabricated, and then the dielectric layer 600 is filled, such that the dielectric layer 600 matches up with the first sub isolation layer 210 and the second sub isolation layer 220 to form an isolation structure for the word line 510.

It should be noted that the semiconductor structure provided by this embodiment of the present disclosure enables isolation structures in different regions to be separately fabricated. In some embodiments, the isolation layer 200 including the first sub isolation layer 210 and the second sub isolation layer 220 is fabricated earlier than the word line 510, to enlarge an opening for fabricating the word line 510. In addition, a depth-to-width ratio of a channel during deposition of the word line 510 is decreased, to improve deposition quality of the word line 510. In addition, the dielectric layer 600 is fabricated later than the word line 510, to provide isolation protection to the word line 510 and other structures.

It is worth noting that in the process of fabricating the word line 510, the dielectric layer 600 is not fabricated yet and the first groove 130 is in an opening shape. Therefore, the word line 510 can be relatively easily fabricated on the surface of the first sub isolation layer 210 in the first groove 130, thereby simplifying the fabrication processes. In addition, in the process of fabricating the word line 510, because the word line 510 is not blocked by the dielectric layer 600, the word line 510 may quickly fill up an opening formed at an intersection between the surface of the first sub isolation layer 210 and a surface of the second sub isolation layer 220, to avoid occurrence of a deposition void region, and increase yield of semiconductor structure.

In one embodiment, a material of the substrate 100 may be silicon. In another embodiment, the material of the substrate 100 may further be another material such as germanium, silicon germanium, silicon carbide, gallium arsenide or indium gallium. In some embodiments, the substrate 100 may also be other type of substrate 100 such as a silicon-on-insulator substrate 100 or a germanium-on-insulator substrate 100, which is not to be described in detail.

Figure 7A:
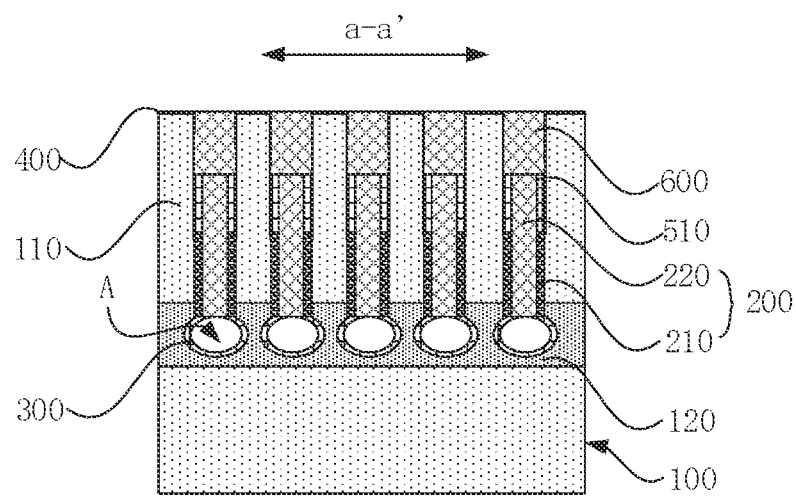
Figure 7B:
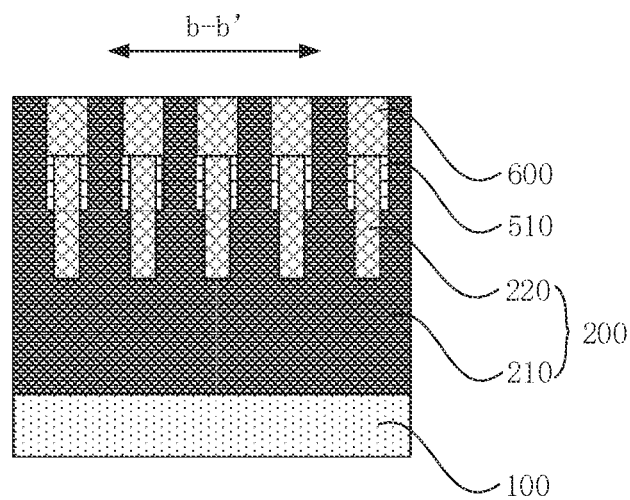
Figure 7C:
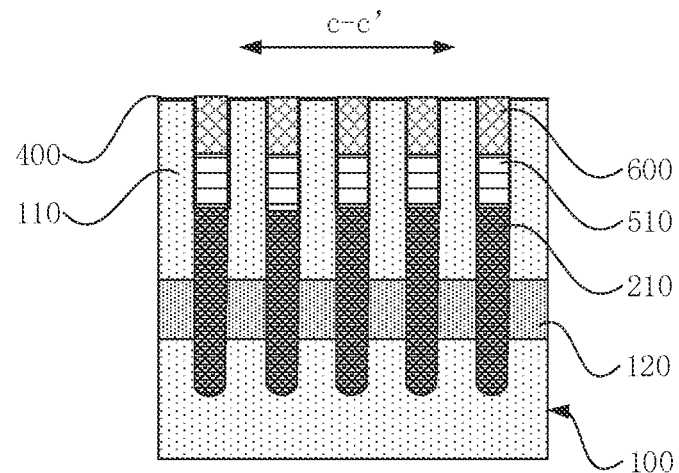
Figure 7D:
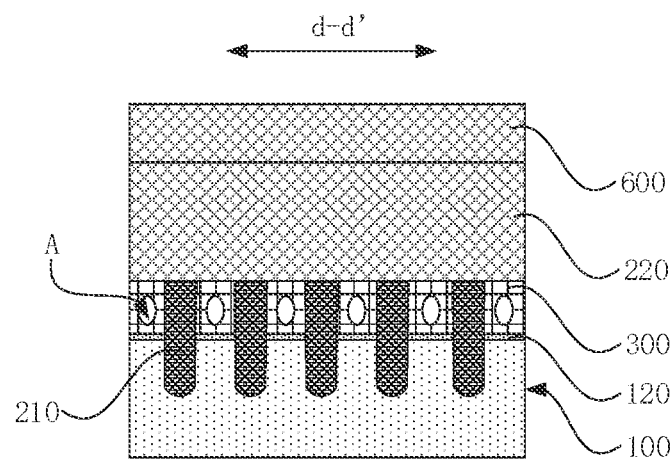

In one embodiment, as shown in FIG. 7A, a top surface of the second sub isolation layer 220 is lower than a top surface of the pillar 110.

It should be noted that by controlling the top surface of the second sub isolation layer 220 to be lower than the top surface of the pillar 110, the height of the second sub isolation layer 220 in the third direction may be reduced, to save a support structure, thereby facilitating subsequent fabrication of the word line 510 and facilitating fabrication of a gate-all-around (GAA) structure.

In one embodiment, as shown in FIG. 7A, a top surface of the word line 510 is flush with the surface of the first sub isolation layer 210.

It should be noted that when the top surface of the word line 510 is flush with that of the second sub isolation layer 220, the top surface of the word line 510 and the top surface of the second sub isolation layer 220 form a plane, such that the dielectric layer 600 can be sufficiently filled everywhere in the first groove 130 as much as possible during fabrication of the dielectric layer 600, to ensure that the isolation structure formed by means of cooperation can effectively isolate the word line 510 from other structures.

In another embodiment, as shown in FIG. 12, the top surface of the word line 510 is lower than the top surface of the second sub isolation layer 220.

It should be noted that when the top surface of the word line 510 is lower than that of the second sub isolation layer 220, the dielectric layer 600 fabricated subsequently may be partially placed in a layer difference space between the top surface of the word line 510 and the top surface of the second sub isolation layer 220, such that the dielectric layer 600 may sufficiently come into contact with the second sub isolation layer 220, to ensure that the isolation structure formed by means of cooperation can effectively isolate the word line 510 from other structures.

In one embodiment, a material of the word line 510 is one of molybdenum, cobalt, tungsten or titanium.

It should be noted that molybdenum (Mo), cobalt (Co), tungsten (W) or titanium (Ti) is transition metal, and the metal layer 500 fabricated by using the transition metal is a transition metal layer 500.

Of course, the metal layer 500 may also be formed by means of a derivative of Mo, Co, W or Ti. In some embodiments, the material of the metal layer 500 may be a transition metal silicide formed from tungsten silicide, cobalt silicide, nickel silicide or titanium silicide.

In one embodiment, a material of the first sub isolation layer 210 is an oxide, and a material of the second sub isolation layer 220 is a nitride.

It is worth noting that the first sub isolation layer 220 is positioned between the substrate 100 and the second sub isolation layer 220, such that an interface characteristic between the substrate 100 and the isolation layer 200 can be improved. The material of the first sub isolation layer 210 may be, but is not limited to, a silicon dioxide.

In addition, a nitride has an oxygen selectivity, and the material may undergo selective oxidation during photolithography, to facilitate fabrication of film layers. When the material of the second sub isolation layer 220 is selected to be a nitride, selective etching may be facilitated.

In one embodiment, the material of the second sub isolation layer 220 is silicon nitride (SiN) or silicon oxynitride (SiON).

In one embodiment, a material of the dielectric layer 600 is an oxide or a nitride.

It is to be understood that the dielectric layer 600 made of a nitride or an oxide can match up with the second sub isolation layer 220 to form a part of the isolation structure.

In one embodiment, the material of the dielectric layer 600 is a nitride.

It is to be understood that the material of the dielectric layer 600 and the material of the second sub isolation layer 220 may be the same or may be different. In one embodiment, the material of the dielectric layer 600 is the same as the material of the second sub isolation layer 220, such that the dielectric layer 600 and the second sub isolation layer 220 can effectively exert the isolation and protection effect.

In another embodiment, the material of the dielectric layer 600 is an oxide.

Other embodiments of the present disclosure will be apparent to those skilled in the art from consideration of the specification and practice of The present disclosure disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

It is to be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A method for fabricating a semiconductor structure, comprising:

provifing a substrate, wherein pillars arranged in an array are formed on a surface of the substrate, and bit lines extending along a first direction are formed at bottoms of the pillars;

forming a first groove extending along a second direction between adjacent two of the pillars, the second direction being perpendicular to the first direction;

forming an isolation layer on the substrate, the isolation layer being filled in the first groove and being filled between adjacent two of the bit lines, the isolation layer comprising a first sub isolation layer and a second sub isolation layer, wherein the first sub isolation layer covers the surface of the substrate, a side wall of the first groove, and a part of a bottom wall of the first groove; and the second sub isolation layer covers a remaining part of the bottom wall of the first groove;

etching the isolation layer to expose a surface of each of the pillars, wherein a surface of the first sub isolation layer positioned in the first groove is lower than a surface of the second sub isolation layer;

forming, on the first sub isolation layer, a word line surrounding a side wall of each of the pillars, wherein a surface of the word line is not higher than the surface of the second sub isolation layer; and forming a dielectric layer on the word line, wherein the dielectric layer covers the second sub isolation layer and the word line, and the dielectric layer and the isolation layer form an isolation structure for the word line.

2. The method for fabricating a semiconductor structure according to claim 1, wherein the etching the isolation layer comprises:

etching the isolation layer to expose the surface of each of the pillars, wherein the first sub isolation layer and the second sub isolation layer have a preset etching selectivity, and an etching rate of the first sub isolation layer is greater than an etching rate of the second sub isolation layer; and continuing etching the first sub isolation layer and the second sub isolation layer until the surface of the first sub isolation layer positioned in the first groove is lower than the surface of the second sub isolation layer, and the surface of the second sub isolation layer is lower than the surface of each of the pillars.

3. The method for fabricating a semiconductor structure according to claim 2, wherein the preset etching selectivity between the first sub isolation layer and the second sub isolation layer ranges from 2 to 5.

4. The method for fabricating a semiconductor structure according to claim 1, wherein the forming an isolation layer on the substrate comprises:

forming the first sub isolation layer on the surface of the substrate, wherein the first sub isolation layer is filled in the first groove and is filled between the adjacent bit lines, and the first sub isolation layer covers the surface of each of the pillars;

patterning the first sub isolation layer, and forming, in the first sub isolation layer in the first groove, a second groove extending along the second direction, wherein a surface of the bit line is exposed from the second groove, and a width of the second groove in the first direction is smaller than a width of the first groove in the first direction; and filling the second groove with the second sub isolation layer.

5. The method for fabricating a semiconductor structure according to claim 1, wherein before the forming, on the first sub isolation layer, a word line surrounding a side wall of each of the pillars, the method further comprises:

forming a gate oxide layer on the substrate, wherein the gate oxide layer covers the surface of each of the pillars and a side wall, not covered by the first sub isolation layer, of each of the pillars.

6. The method for fabricating a semiconductor structure according to claim 5, wherein the forming, on the first sub isolation layer, a word line surrounding a side wall of each of the pillars comprises:

forming a metal layer on the first sub isolation layer, wherein the metal layer fills the first groove and covers the surface of the second sub isolation layer, and the metal layer surrounds the surface of each of the pillars and a surface of the gate oxide layer;

planarizing the metal layer until the gate oxide layer positioned on the surface of each of the pillars is exposed; and etching the metal layer positioned in the first groove until the surface of the second sub isolation layer is exposed, to form the word line.

7. The method for fabricating a semiconductor structure according to claim 6, wherein a material of the metal layer is one of molybdenum, cobalt, tungsten or titanium.

8. The method for fabricating a semiconductor structure according to claim 7, wherein the forming a metal layer on the first sub isolation layer comprises:

deposing one of molybdenum, cobalt or tungsten by means of atomic layer deposition, to form the metal layer.

9. The method for fabricating a semiconductor structure according to claim 7, wherein the forming a metal layer on the first sub isolation layer comprises:

deposing titanium by means of vapor deposition, to form the metal layer.

10. The method for fabricating a semiconductor structure according to claim 7, wherein the planarizing the metal layer comprises:

planarizing the metal layer by means of chemical mechanical polishing until the gate oxide layer positioned on the surface of each of the pillars is exposed.

11. The method for fabricating a semiconductor structure according to claim 6, wherein the forming a gate oxide layer on the substrate comprises:

growing the gate oxide layer on the surface of each of the pillars and the side wall, not covered by the first sub isolation layer, of each of the pillars by means of an in-situ steam generation process or a rapid thermal oxidation process.

12. The method for fabricating a semiconductor structure according to claim 1, wherein a material of the first sub isolation layer is an oxide, and a material of the second sub isolation layer is a nitride.

13. The method for fabricating a semiconductor structure according to claim 12, wherein a material of the dielectric layer is an oxide or a nitride.

14. The method for fabricating a semiconductor structure according to claim 1, wherein a material of a part of the bit line is a metal silicide.

15. A semiconductor structure, wherein the semiconductor structure is fabricated by using the method for fabricating a semiconductor structure according to claim 1.

* * * * *